(12) United States Patent
Grill et al.

(10) Patent No.: US 8,637,412 B2
(45) Date of Patent: Jan. 28, 2014

(54) PROCESS TO FORM AN ADHESION LAYER AND MULTIPHASE ULTRA-LOW K DIELECTRIC MATERIAL USING PECVD

(75) Inventors: Alfred Grill, White Plains, NY (US); Thomas Jasper Haigh, Jr., Claverack, NY (US); Kelly Malone, Newburgh, NY (US); Son Van Nguyen, Schenectady, NY (US); Vishnubhai Vitthalbhai Patel, Yorktown Heights, NY (US); Hosadurga Shobha, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/214,157

(22) Filed: Aug. 19, 2011

(65) Prior Publication Data

US 2013/0043514 A1   Feb. 21, 2013

(51) Int. Cl.
*H01L 21/31*   (2006.01)
*H01L 21/469*   (2006.01)

(52) U.S. Cl.
USPC .......................................... 438/778; 257/288

(58) Field of Classification Search
USPC .......................................... 438/778; 257/288
See application file for complete search history.

(56) References Cited

U.S. PATENT DOCUMENTS

| | | |
|---|---|---|
| 6,312,793 B1 | 11/2001 | Grill |
| 6,818,570 B2 | 11/2004 | Tsuji |
| 6,852,650 B2 | 2/2005 | Matsuki |
| 6,881,683 B2 | 4/2005 | Matsuki |
| 7,064,088 B2 | 6/2006 | Hyodo |
| 7,202,564 B2 | 4/2007 | Nguyen |
| 7,265,437 B2 | 9/2007 | Nguyen |
| 7,494,938 B2 | 2/2009 | Nguyen |
| 7,655,577 B2 | 2/2010 | Hyodo |
| 2008/0009141 A1* | 1/2008 | Dubois et al. ................. 438/758 |

* cited by examiner

*Primary Examiner* — Stephen W Smoot
*Assistant Examiner* — Vicki B Booker
(74) *Attorney, Agent, or Firm* — Louis J. Percello; Robert M. Trepp

(57) ABSTRACT

A first PECVD process incorporating a silicon oxide precursor alone and then with an organo-silicon precursor with increasing flow while the flow of the silicon oxide precursor is reduced to zero provides a graded carbon adhesion layer whereby the content of C increases with layer thickness and a second PECVD process incorporating an organo-silicon precursor including an organic porogen provides a multiphase ultra-low k dielectric. The multiphase ultra-low k PECVD process uses high frequency radio frequency power just above plasma initiation in a PECVD chamber. An energy post treatment is also provided. A porous SiCOH dielectric material having a k less than 2.7 and a modulus of elasticity greater than 7 GPa is formed.

15 Claims, 7 Drawing Sheets

PROCESS TO FORM AN ADHESION LAYER AND MULTIPHASE ULTRA-LOW K DIELECTRIC MATERIAL USING PECVD

BACKGROUND

The present invention relates to a process to form multiphase ultra low k dielectric material and more particularly to a plasma enhanced chemical vapor deposition (PECVD) process to form porous SiCOH and to a dielectric material having a k lower than 2.7 and a modulus of elasticity greater than 7 GPa.

BRIEF SUMMARY OF THE INVENTION

In accordance with the present invention, a method for forming an ultra low k dielectric layer comprising selecting a plasma enhanced chemical vapor deposition chamber; placing a substrate in the chamber; introducing an organo-silicon precursor including an organic porogen into the chamber; heating the substrate to a temperature in the range from 200° C. to 350° C.; controlling the amount of an oxidant gas in the chamber; forming a deposited layer by applying a high frequency radio frequency power in the chamber to initiate a plasma and polymerization of the organo-silicon precursor and retain at least a fraction of the organic porogen in the deposited layer; after a period of time terminating the plasma in the chamber; and applying to the deposited layer an energy post treatment selected from the group consisting of thermal anneal, ultra violet (UV) radiation, and electron beam irradiation to drive out the organic porogen and increase the porosity in the deposited layer to at least five percent.

The invention further provides a porous SiCOH dielectric material having a tri-dimensional random covalently bond network of Si—O, Si—C, Si—CH$_2$—Si, C—O, Si—H and C—H bonds, a dielectric constant k lower than 2.7 and a modulus of elasticity greater than 7 GPa.

The invention further provides a semiconductor integrated circuit comprising interconnect wiring having a porous SiCOH dielectric material having a tri-dimensional random covalently bond network having a dielectric constant k lower than 2.7 and a modulus of elasticity greater than 7 GPa.

The invention further provides a semiconductor integrated circuit comprising a FET having a gate stack spacer including a porous SiCOH dielectric material having a tri-dimensional random covalently bond network having a dielectric constant k lower than 2.7 and a modulus of elasticity greater than 7 GPa.

BRIEF DESCRIPTION OF THE SEVERAL VIEWS OF THE DRAWINGS

These and other features, objects, and advantages of the present invention will become apparent upon consideration of the following detailed description of the invention when read in conjunction with the drawing in which.

DETAILED DESCRIPTION

Figure 1:
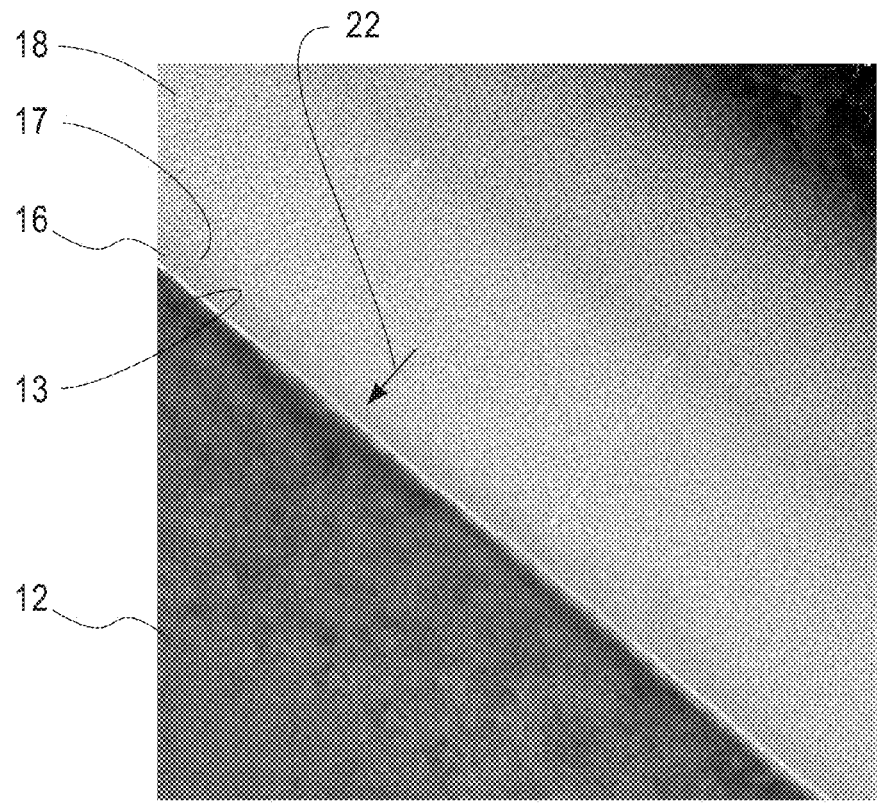
FIG. 1 is a cross-section view of one embodiment of the invention showing an adhesion layer and a dielectric layer.

Referring now to the drawing, FIG. 1 shows a cross-section view of a first embodiment of the invention showing a silicon substrate 12, a graded dielectric layer 16 and a dielectric layer 18. Graded dielectric layer 16 is formed on upper surface 13 of silicon substrate 12. Upper surface 13 of silicon substrate 12 may contain 0.78 nm of native oxide and will be considered to be part of silicon substrate 12. Dielectric layer 18 is formed on upper surface 17 of graded dielectric layer 16. Graded dielectric layer 16 may have a thickness of 4.71 nm at the location shown by arrow 22. Graded dielectric layer 16 may have a thickness in the range from 3 to 7 nm or less. Dielectric layer 18 may have a thickness in the range from 1 nm to 400 nm.

Figure 2:
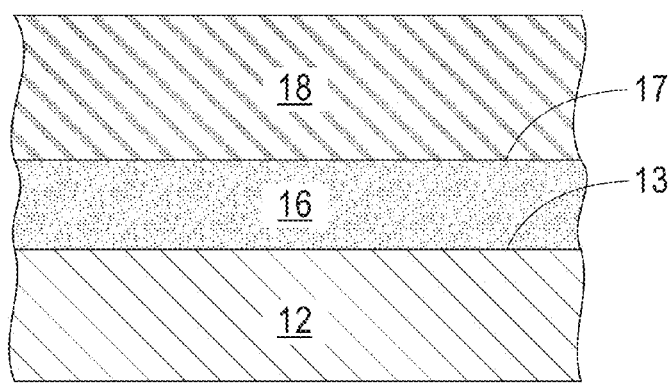
FIG. 2 is a cross-section diagram illustrating the structure of FIG. 1.

FIG. 2 is a cross-section diagram illustrating the structure of FIG. 1. Graded dielectric layer 16 functions as an adhesion layer on silicon substrate 12. Silicon substrate 12 may be replaced with a semiconductor, insulator, metal or combinations thereof. Graded dielectric layer 16 may be formed in a plasma enhanced chemical vacuum deposition (PECVD) chamber by initially introducing a silicon oxide precursor alone followed by concurrently introducing an organo-silicon precursor while reducing the flow of silicon oxide precursor over time to zero. Graded dielectric layer 16 has a carbon content starting at zero and which increases with depth. The carbon content of graded dielectric layer 16 may be above 30 percent to a high of 37.7 percent as-deposited. The carbon content maximum of graded dielectric layer 16 may be reduced to 31.3 percent during an energy post treatment.

Dielectric layer 18 may be formed in a PECVD chamber by placing a substrate in the chamber and introducing an organo-silicon precursor including an organic porogen into the chamber. The organo-silicon precursor introduced may be a single organo-silicon precursor. An organo-silicon precursor may be selected from the group consisting of octamethylcyclotetrasiloxane (OMCTS) and 1,3,5,7-tetraoctamethylcyclotetrasiloxane (TMCTS), diethoxymethylsilane (DEMS), diethyldimethoxysilane (DMDMOS), diethyldimethoxysilane (DEDMOS), other cyclic and non-cyclic silanes, and other cyclic and non-cyclic siloxanes. The pressure in the chamber is controlled to be in the range from 5 to 9 Torr. and preferably about 7 Torr. Substrate 12 may be heated to a temperature in the range from 200° C. to 350° C. and preferably heating only in the range from 200° C. to 250° C. The flow of an oxidant gas into the chamber is controlled and may be reduced to zero after graded dielectric layer 16 is formed and prior to forming dielectric layer 18. The oxidant gas may be selected from the group consisting of $O_2$, $H_2O$, $CH_3OH$, and $C_4H_{10}O$. Other gas that may be introduced into the chamber may be inert Ar, a reactive oxygenated gas and an oxygenated hydrocarbon gas. Dielectric layer 18 may have a tri-dimensional random covalently bond network of Si—O, Si—C, Si—$CH_2$—Si, C—O, Si—H and C—H bonds, a dielectric constant k lower than 2.7 and a modulus of elasticity greater than 7 GPa or a dielectric constant k lower than 2.6 and a modulus of elasticity greater than 6 GPa. The modulus of elasticity in dielectric layer 18 is uniform in all directions or isotropic.

Dielectric layer 18 may be formed by applying high frequency radio frequency power in the PECVD chamber just above the plasma initiation power level. The high frequency power may be at or greater than 400 kHz and the radio frequency power may be at or greater than 13.56 MHz. The power just above the plasma initiation power level is typically a power increase above plasma initiation in the range from 75 to 800 watts for a 300 mm radius substrate in a Plasma CVD chamber and preferable in the range from 150 to 450 watts for a 300 mm radius substrate in a Plasma CVD chamber to maintain a stable plasma at minimum power. By setting the high frequency radio frequency power just above plasma initiation, an increase in polymerization occurs and an increase in retention of an organic porogen in the deposited dielectric layer occurs. Further, minimum plasma dissociation of an organic functional group occurs in the plasma and cross-linking of large molecules occur to form a deposited dielectric layer with a high degree of porosity in the range from 5 to 16.5 percent after an energy post treatment.

The growth of dielectric layer 18 is stopped or terminated by lowering the high frequency radio frequency power in the PECVD chamber until the plasma terminates. The as-deposited dielectric layer 18 may have a dielectric constant in the range from 2.63 to 2.65, a porosity in the range from 5.5 to 8.5 percent, a pore diameter in the range from 1 to 1.2 nm, a modulus of elasticity in the range from 1.18 to 6.3 GPa, a hardness in the range from 0.28 to 0.59, a carbon content in the range from 37.7 to 32.5 atomic percent, an oxygen content in the range from 29.6 to 32.4 atomic percent, a silicon content in the range from 32.8 to 34.9 atomic percent, a stress in the range from 19 to 40 MPa and a ratio of stress/modulus of elasticity in the range from 16.1 to 15.5. The organo-silicon precursor for the dielectric layer measured to obtain the above data was octamethylcyclotetrasiloxane (OMCTS) with the optional addition of an oxygen oxidant source (i.e. $O_2/N_2O$). The measurements were made from dielectric layers made at substrate temperatures of 250° C., 280° C., 300° C. and 350° C.

The as-deposited dielectric layer 18 may be subjected to an energy post treatment of ultra violet radiation for a time period of 300 sec at a dielectric layer temperature above 200° C. to increase Si—$CH_2$—Si cross linking bonds in dielectric layer 18. Dielectric layer 18 typically has two adjacent Si—$CH_3$+Si—$CH_3$ chemical bonds in the deposited dielectric layer which change to Si—$CH_2$—Si bonds to increase the modulus of elasticity and hardness of dielectric layer 18 and outgas of volatile $CH_4$ to create additional pores in deposited dielectric layer 18. The energy post treatment thermal anneal may include heating the as-deposited dielectric layer 18 to a temperature in the range from 200° C. to 430° C. in an ambient of forming gas ($H_2$ and $N_2$) for a period of time greater than 40 minutes.

The as-deposited dielectric layer 18 characteristics for the dielectric layer described above change after an energy post treatment of ultra violet radiation for a time period of 300 sec at a temperature above 200° C. The wavelength of UV may be a narrow spectrum or a broad spectrum. Certain wavelengths of UV enhance specific reactions. Dielectric layer 18 after the energy post treatment has a dielectric constant in the range from 2.39 to 2.60, a porosity in the range from 13.8 to 16.6 percent, a pore diameter in the range from 0.8 to 1.0 nm, a modulus of elasticity in the range from 4.92 to 13.83 GPa, a hardness in the range from 1.27 to 1.75, a carbon content in the range from 31.3 to 32.3 atomic percent, an oxygen content in the range from 33.7 to 34.4 atomic percent, a silicon content in the range from 34.4 to 35.2 atomic percent, a stress in the range from 73 to 110 MPa and a ratio of stress/modulus of elasticity in the range from 6.8 to 16.9.

Other energy post treatment besides UV radiation may be thermal anneal and electron beam (EB) irradiation. Thermal anneal treatment is especially applicable where dielectric layer 18 is vertical such as if used as a gate stack sidewall spacer on a field effect transistor or if portions of the layer are vertical and other portions are horizontal. UV radiation and EB irradiation may provide an uneven exposure to a vertical dielectric layer. Energy post treatment functions to drive out the organic porogen and to increase the porosity in the deposited dielectric layer 18. Dielectric layer 18 may have a dielectric constant lower than 2.7 and a modulus of elasticity greater than 7 GPa or greater than 8 GPa or a dielectric constant lower than 2.5 and a modulus of elasticity greater than 6 GPa.

Figure 3:
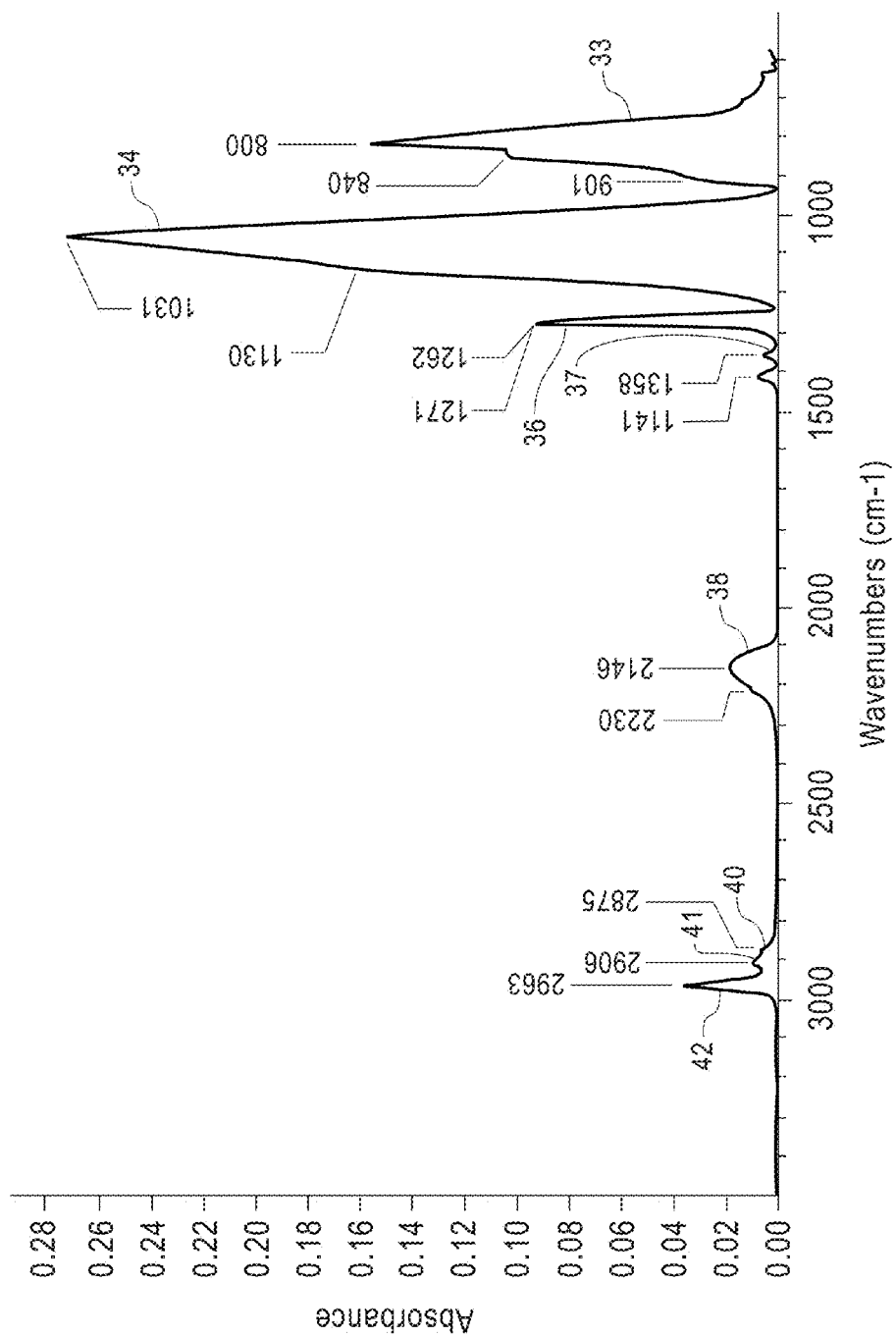
FIG. 3 is a graph of Fourier Transform Infrared (FTIR) spectrum obtained from an as-deposited multiphase porous SiCOH film in which the marked absorbance peak at 1358 cm$^{-1}$ of Si—CH$_2$—Si bonds is noted.

FIG. 3 is a graph of Fourier Transform Infrared (FTIR) spectrum shown by curve 33 obtained from an as-deposited dielectric layer 18 where the organo-silicon precursor was octamethylcyclotetrasiloxane (OMCTS). In FIG. 3 the ordinate represents Absorbance and the abscissa represents Wavenumbers ($cm^{-1}$). The spectrum displays a strong Si—O absorption band 34 at 975-1200 $cm^{-1}$ with an absorbance of 0.274, a Si—$CH_3$ absorption peak 36 at 1271 $cm^{-1}$ with an absorbance of 0.093, a Si—H absorption band 38 at 2146-2230 $cm^{-1}$ with an absorbance of 0.02, and small C—H absorption peaks 40, 41 and 42 at 2875-2990 $cm^{-1}$ with a respective absorbance of 0.008, 0.012 and 0.037. The marked absorption peak 37 at 1358 $cm^{-1}$ of Si—$CH_2$—Si is shown with an absorbance of 0.005.

Figure 4:
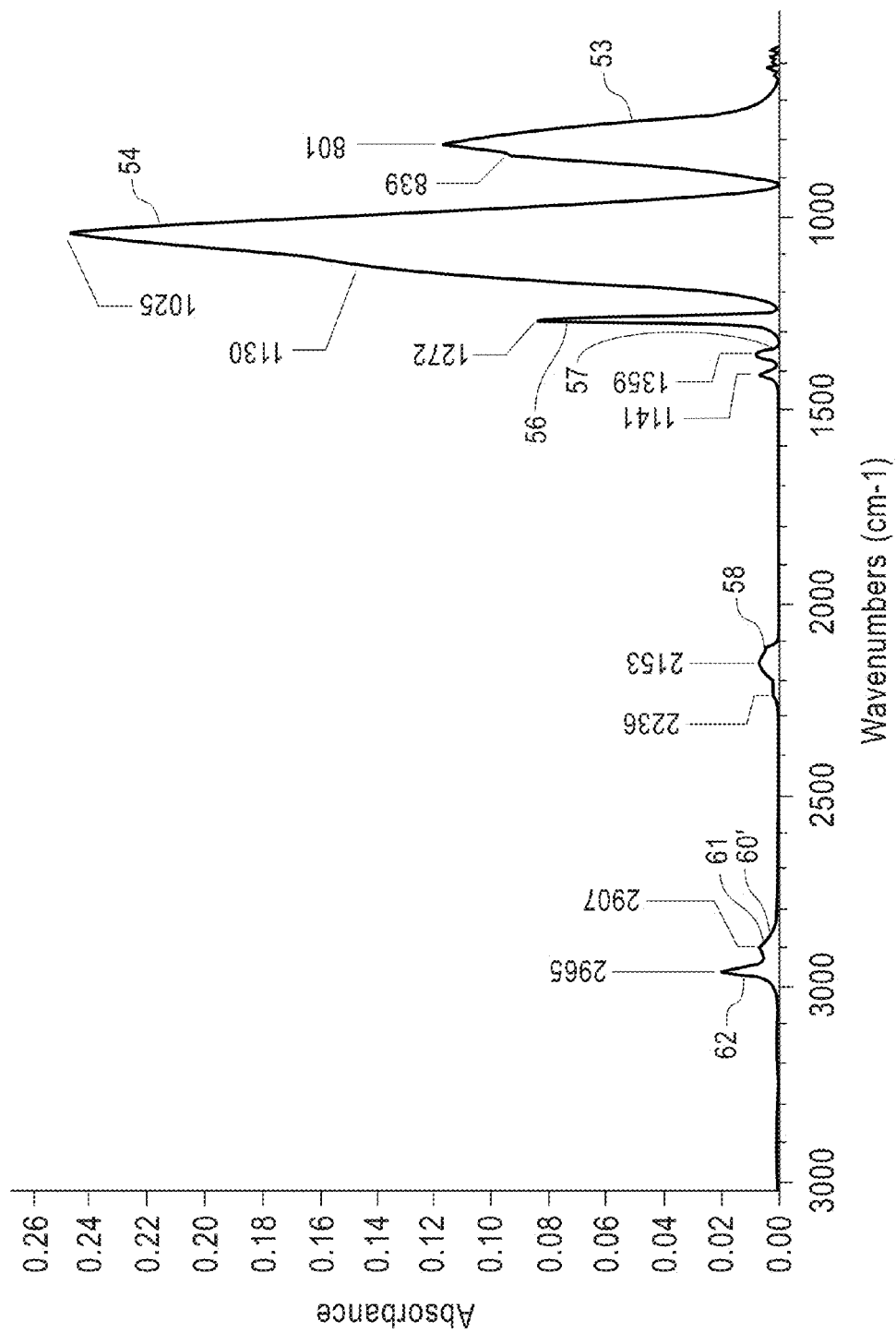
FIG. 4 is a graph of FTIR spectrum obtained from the same film referred to in FIG. 3 after the as-deposited film is subjected to an energy post treatment with ultra violet (UV) radiation in which the marked absorbance peak at 1359 cm$^{-1}$ of Si—CH$_2$—Si bonds is noted

FIG. 4 is a graph of Fourier Transform Infrared (FTIR) spectrum shown by curve 53 obtained from the as-deposited dielectric layer 18 measured in FIG. 3 after energy post treatment. In FIG. 4 the ordinate represents Absorbance and the abscissa represents Wavenumbers ($cm^{-1}$). The spectrum displays a strong Si—O absorption band 54 at 975-1200 $cm^{-1}$ with an absorbance of 0.249, a Si—$CH_3$ absorption peak 56 at 1271 $cm^{-1}$ with an absorbance of 0.06, a Si—H absorption band 58 at 2146-2230 $cm^{-1}$ with an absorbance of 0.008, and small C—H absorption peaks 60, 61 and 62 at 2875-2990 $cm^{-1}$ with a respective absorbance of 0.006, 0.008 and 0.02.

The marked absorption peak 57 at 1359 $cm^{-1}$ of Si—$CH_2$—Si is shown with an absorbance of 0.0075.

In FIG. 4, S—O absorption band 54 at 975-1200 $cm^{-1}$ is 90.9 percent of absorption band 34 in FIG. 3. Si—$CH_3$ absorption peak 56 at 1271 $cm^{-1}$ is 64.5 percent of absorption peak 36 in FIG. 3. Si—H absorption band 58 at 2146-2230 $cm^{-1}$ is 40 percent of absorption band 38 in FIG. 3. C—H absorption peaks 60', 61 and 62 at 2875-2990 $cm^{-1}$ are 75 percent, 66.6 percent and 54.1 percent respectively of absorption peaks 40, 41 and 42 in FIG. 3. The Si—$CH_2$—Si absorption band 57 at 1359 $cm^{-1}$ in FIG. 4 is 150 percent of the absorption band 37 at 1358 $cm^{-1}$ in FIG. 3.

Figure 5:
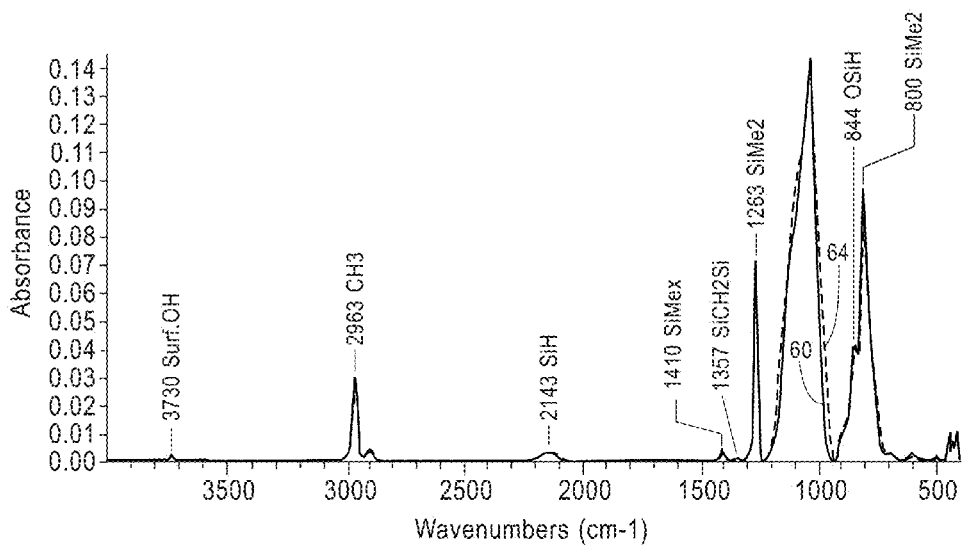
FIG. 5 is a graph of FTIR spectrum obtained from a multiphase porous SiCOH film having an energy post treatment with ultra violet (UV) radiation in which the marked increase in absorbance peak intensity at 1357 cm$^{-1}$ of Si—CH$_2$—Si bonds is noted.

FIG. 5 is a graph of FTIR spectrum obtained from an as-deposited dielectric layer 18 shown by curve 60 and from dielectric layer 18 after being cured by undergoing an energy post treatment with ultra violet radiation shown by curve 64.

In FIG. 5 the ordinate represents Absorbance and the abscissa represents Wavenumbers ($cm^{-1}$). Dielectric layer 18 was formed from an organo-silicon precursor OMCTS deposited at 250° C.

In FIG. 5, curves 60 and 64 have overlapping absorbance peaks but the amplitudes at particular peaks are different. In FIG. 5, wavenumber 800 shows an absorbance peak which corresponds to $Si-Me_2$. Wavenumber 844 shows an absorbance peak which corresponds to O—Si—H. Wavenumber 1263 shows an absorbance peak which corresponds to $Si-Me_2$. Wavenumber 1357 shows an absorbance peak which corresponds to Si—$CH_2$—Si. The marked increase of the absorption peak at wavenumber 1357 of Si—$CH_2$—Si after energy post treatment with UV radiation is shown. Wavenumber 1410 shows an absorbance peak which corresponds to $Si-Me_x$. Wavenumber 2143 shows an absorbance peak which corresponds to Si—H. Wavenumber 2963 shows an absorbance peak which corresponds to $CH_3$. Wavenumber 3730 shows an absorbance peak which corresponds to O—H.

Figure 6:
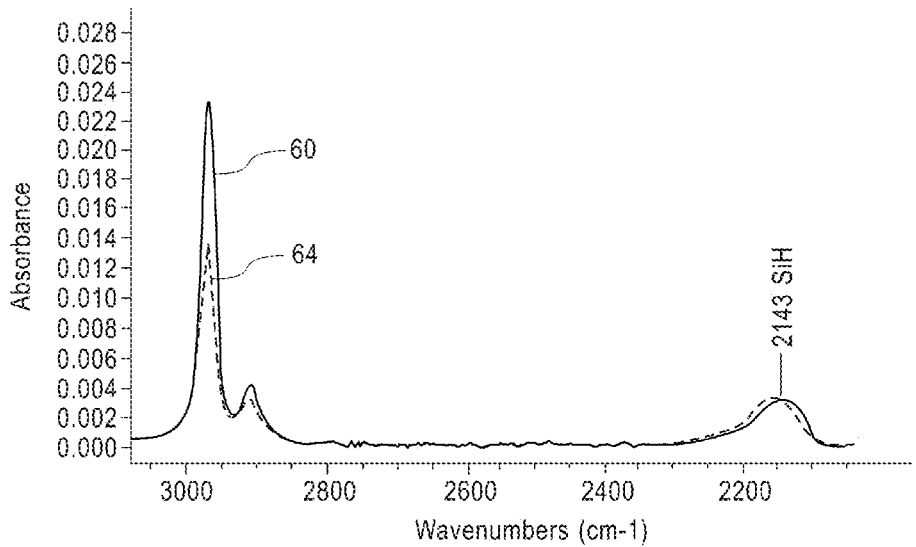
FIGS. 6-8 show enlarged portions of FIG. 5 with changes in the scale of the abscissa and the ordinate.
Figure 7:
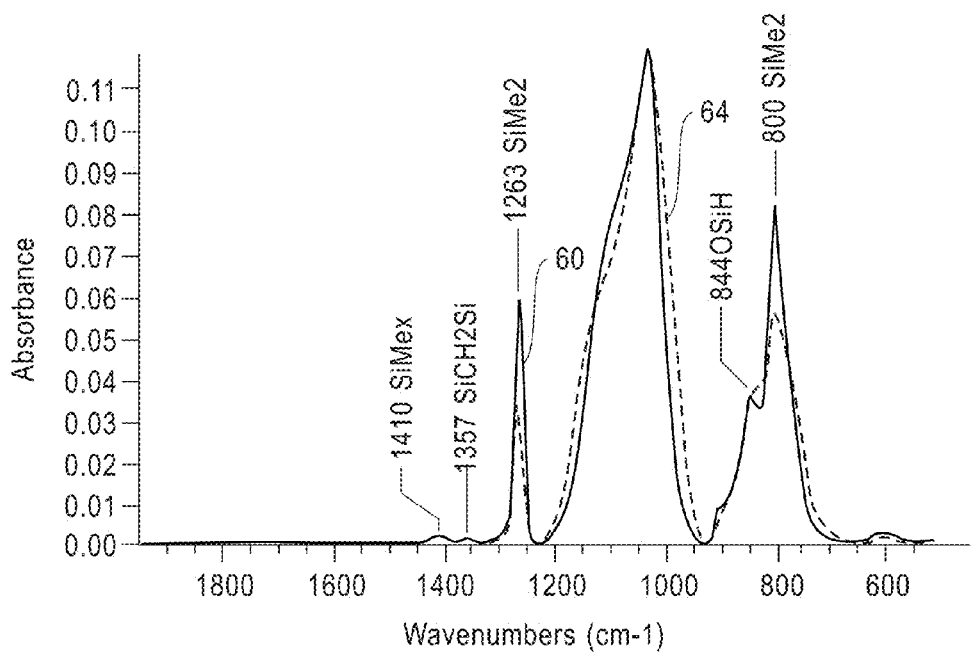
Figure 8:
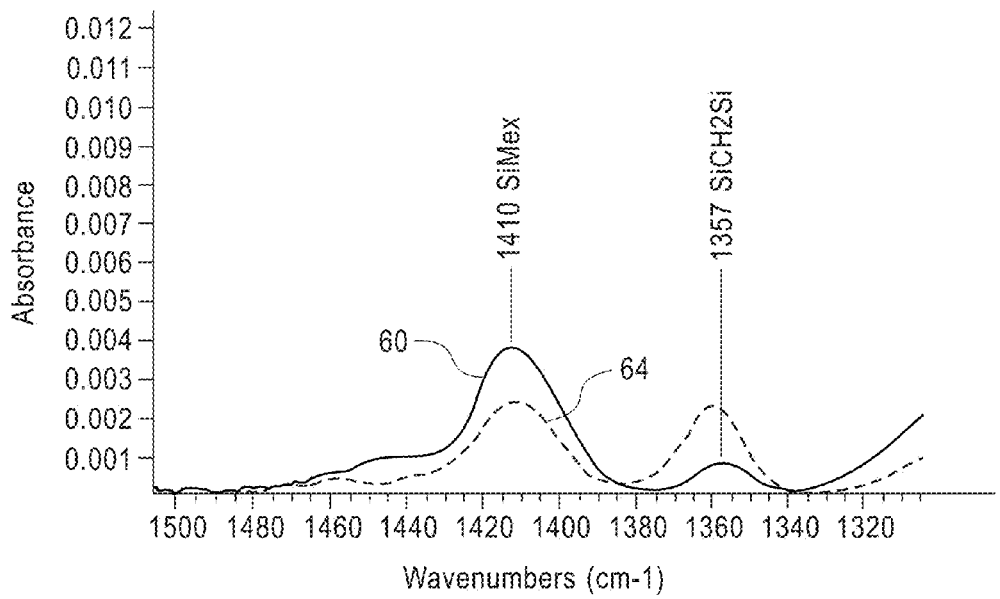

FIGS. 6-8 show enlarged portions of FIG. 5 with changes in the scale of the abscissa and the ordinate. FIGS. 6-8 show the amplitude of absorbance peaks of curves 60 and 64 at the same wavenumber. In FIG. 6, wavenumber 2963 corresponding to $CH_3$ shows curve 60 has an amplitude of 0.0236 and curve 64 has an amplitude of 0.0135 which is a reduction of 57.2 percent. In FIG. 7, wavenumber 800 corresponding to $Si-Me_2$ shows curve 60 has an amplitude of 0.082 and curve 64 has an amplitude of 0.057 which is a reduction of 69.5 percent. In FIG. 7, wavenumber 1263 corresponding to $Si-Me_2$ shows curve 60 has an amplitude of 0.06 and curve 64 has an amplitude of 0.035 which is a reduction of 58.3 percent. In FIG. 8, wavenumber 1357 corresponding to Si—$CH_2$—Si shows curve 60 has an amplitude of 0.001 and curve 64 has an amplitude of 0.0024 which is an increase of 240 percent. This indicates an increase of 240 percent in Si—$CH_2$—Si after energy post treatment UV radiation. It should also be noted that the low vibrational intensity of Si—$CH_2$—Si is due to the strong bonding of $CH_2$ to two Si atoms. Also in FIG. 8, wavenumber 1410 corresponding to $Si-Me_x$ shows curve 60 has an amplitude of 0.0375 and curve 64 has an amplitude of 0.0025 which is a reduction of 58.3 percent. The increase in Si—$CH_2$—Si after energy post treatment is shown in FIG. 8 by an increase in wavenumber 1357 peak absorbance amplitude of 240 percent. The 240 percent increase, improves the modulus of elasticity and hardness of dielectric layer 18. Energy post treatment with ultra violet radiation results in removal or reduction of $CH_3$ as shown in FIG. 6 and results in removal or reduction of $Si-Me_2$ as shown in FIG. 7 from dielectric layer 18.

Figure 9:
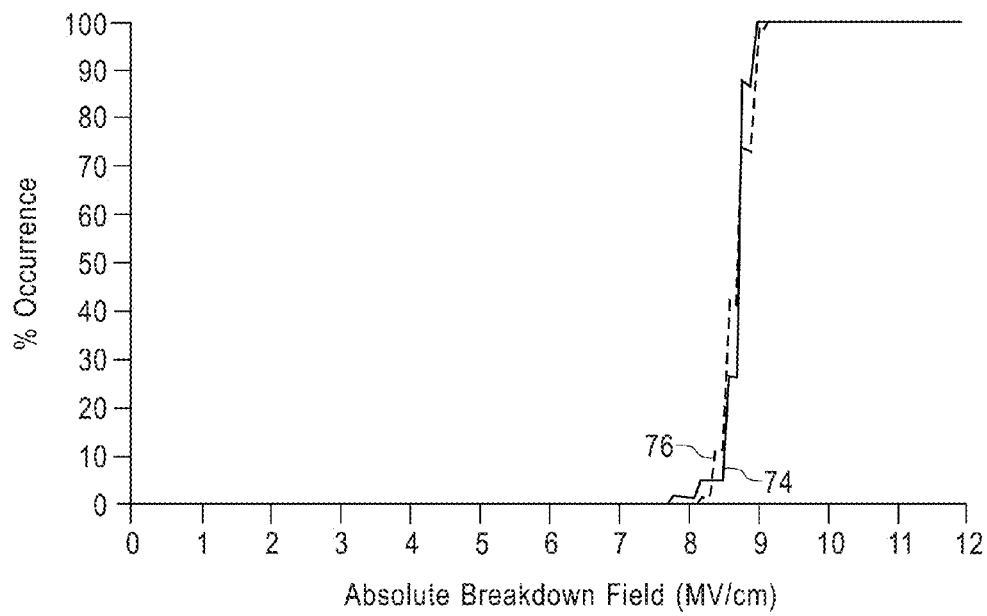
FIG. 9 is a graph of the absolute breakdown field as a function of percent occurrence of an embodiment of the invention.

FIG. 9 is a graph showing curves 74 and 76 of the absolute breakdown field as a function of percent occurrence of dielectric layer 18. Dielectric layer 18 was made with OMCTS as the organo-silicon precursor. In FIG. 9, the ordinate represents Percent Occurrence and the abscissa represents Absolute Breakdown Field (MV/cm). Curve 74 was measured from an as-deposited dielectric layer 18 with the lowest breakdown electric field being at about 7.75 MV/cm. Curve 76 was measured from a dielectric layer 18 after energy post treatment with UV radiation.

Figure 10:
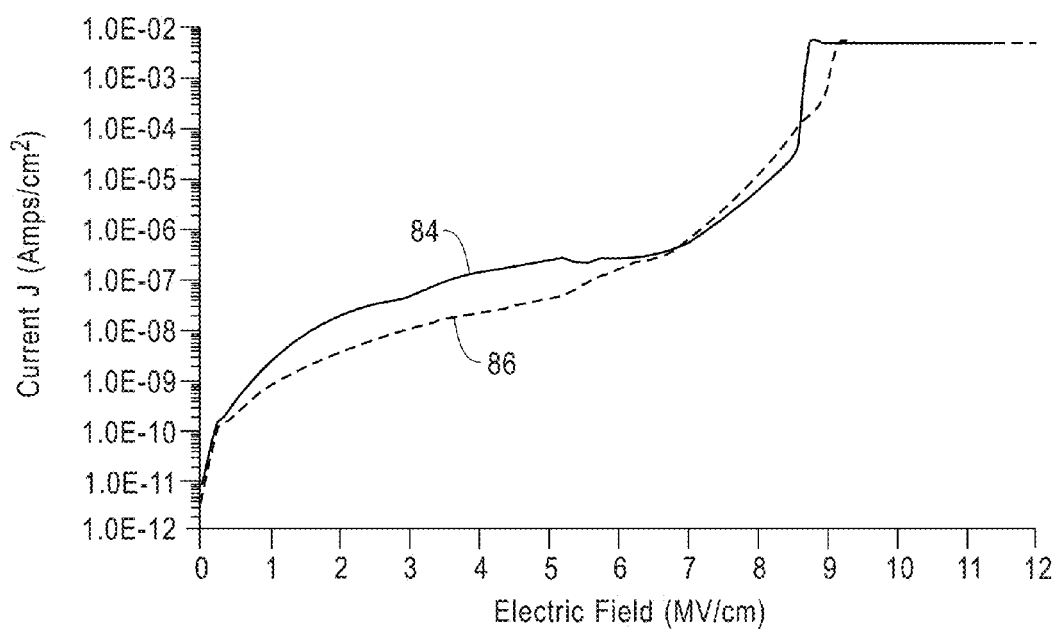
FIG. 10 is a graph of the current leakage as a function of the electric field of an embodiment of the invention.

FIG. 10 is a graph showing curves 84 and 86 of the Current Leakage as a function of Electric Field of dielectric layer 18. Dielectric layer 18 was made with OMCTS as the organo-silicon precursor. In FIG. 10, the ordinate represents Current J ($Amps/cm^2$) and the abscissa represents Electric Field (MV/cm). Curve 84 was measured at 150° C. from an as-deposited dielectric layer 18. Curve 86 was measured at 150° C. from a dielectric layer 18 after energy post treatment with UV radiation.

Figure 11:
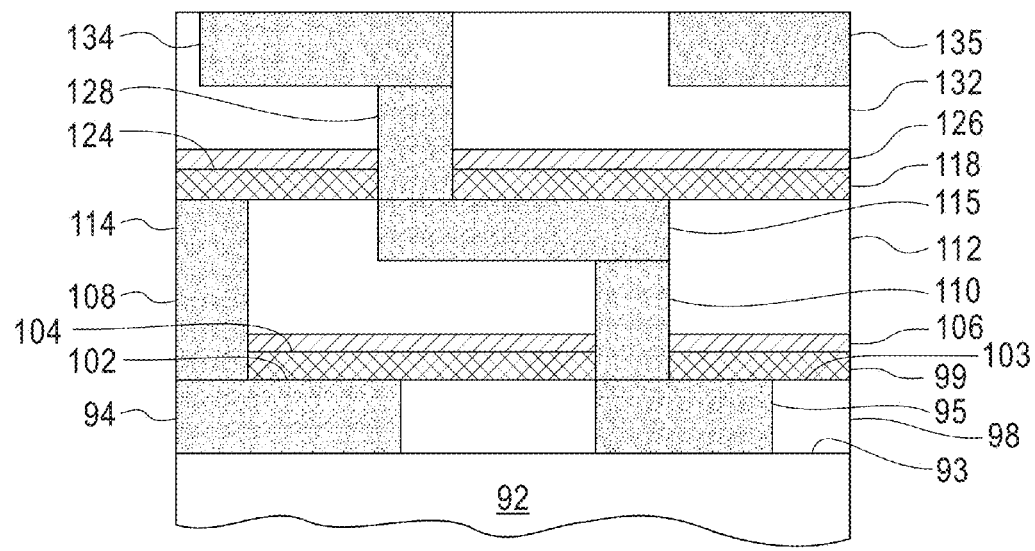
FIG. 11 is a cross-section diagram of another embodiment of the invention showing a dielectric layer incorporated in several interconnect levels in a semiconductor chip.

FIG. 11 is a cross section diagram of another embodiment of the invention showing a back end of the line (BEOL) structure for making interconnections on a semiconductor chip to devices such as FET's. Semiconductor substrate 92 may be a silicon containing substrate containing devices (not shown) and vias (not shown). A first interconnect level with metal wiring 94 and 95 is formed in dielectric layer 98 over upper surface 93 of substrate 92 using a damascene process. A dielectric cap layer 99 is formed over the upper surface 102 of metal wiring 94 and 95 and upper surface 103 of dielectric layer 98.

A second interconnect level comprises graded dielectric layer 106, vias 108 and 110, dielectric layer 112, metal wiring 114 and 115 and dielectric cap layer 118. Graded dielectric layer 106 functions to provide adhesion to upper surface 104 of dielectric cap layer 99. Dielectric cap layer 99 functions to provide a diffusion barrier to metal from the upper surface of metal wiring 94 and 95.

A third interconnect level comprises graded dielectric layer 126, via 128, dielectric layer 132 and metal wiring 134 and 135. Graded dielectric layer 126 functions to provide adhesion to upper surface 124 of dielectric cap layer 118.

Figure 12:
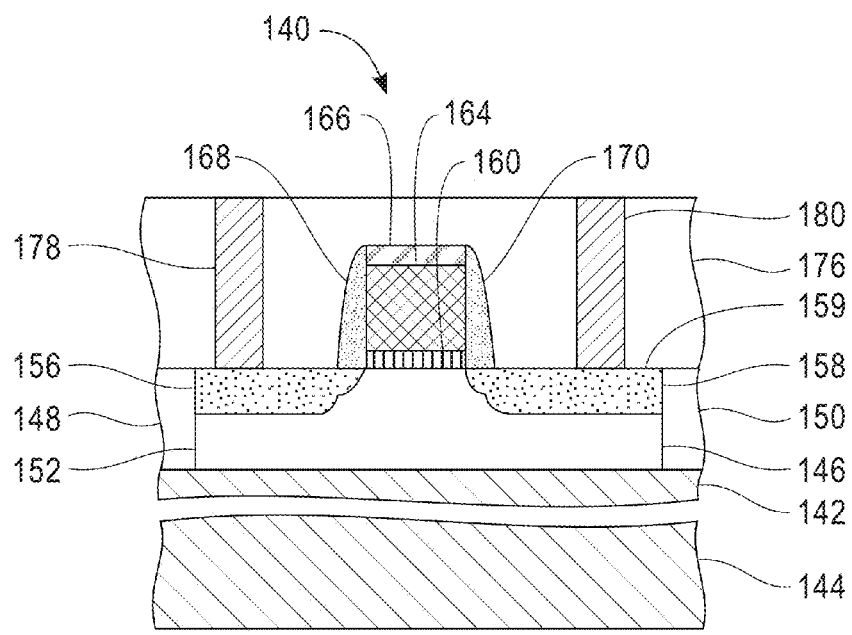
FIG. 12 is a cross-section diagram of yet another embodiment of the invention showing a dielectric spacer adjacent each side of a gate stack of a field effect transistor.

FIG. 12 is a cross section diagram of another embodiment of the invention showing field effect transistor 140 on silicon-on-insulator (SOI) substrate 142. Silicon-on-insulator 142 comprises insulating layer 144 and silicon containing layer 146. Shallow trench isolation regions 148 and 150 electrically isolate silicon region 152 in which FET 140 is formed. Silicon region 152 has source region 156 and drain region 158. Gate dielectric 160 is formed on the upper surface of silicon region 152 in the area between source region 156 and drain region 158. Gate electrode 164 is formed over gate dielectric 160 which may be a semiconductor or metal. A metal gate electrode 166 is formed over gate electrode 164. Sidewall spacers 168 and 170 are formed on the sidewalls of gate electrode 166 and gate electrode 164. Sidewall spacers 168 and 170 may use dielectric layer 18 disclosed above. A dielectric layer 176 is formed over upper surface 159, sidewall spacers 168 and 170, and gate electrode 166. Vias 178 and 180 formed through dielectric layer 176 to source region 156 and drain region 158 provide electrical contact.

In FIGS. 2-12, like references are used for functions or apparatus corresponding to the functions or apparatus of a lower numbered figure.

While there has been described and illustrated a method for forming an ultra low k dielectric layer and a dielectric with k below 2.7 and a modulus of elasticity greater than 7 GPa, it will be apparent to those skilled in the art that modifications and variations are possible without deviating from the broad scope of the invention which shall be limited solely by the scope of the claims appended hereto.

What is claimed is:

1. A method for forming an ultra low k dielectric layer comprising:
    selecting a plasma enhanced chemical vapor deposition chamber;
    placing a substrate in said chamber;
    introducing a first organo-silicon precursor including an organic porogen into said chamber;
    heating said substrate to a temperature in the range from 200° C. to 350° C.;
    controlling the amount of an oxidant gas in said chamber;
    forming a deposited layer by applying high frequency radio frequency power in said chamber to initiate a plasma and polymerization of said first organo-silicon precursor and retain at least a fraction of said organic porogen in said deposited layer;

after a period of time terminating said plasma in said chamber; and applying to said deposited layer an energy post treatment selected from the group consisting of thermal anneal, ultra violet (UV) radiation, and electron beam irradiation to drive out said organic porogen and increase the porosity in said deposited layer to at least five percent;

wherein prior to introducing said first organo-silicon precursor introducing a flow of a silicon oxide precursor alone followed by introducing an increasing flow of a second organo-silicon precursor while reducing said flow of said silicon oxide precursor to form a graded layer where the content of C increases with thickness.

2. The method of claim 1 wherein said applying an energy post treatment includes heating to a temperature above 200° C. for a time period to increase Si—$CH_2$—Si cross linking bonds in said deposited layer.

3. The method of claim 1 wherein said applying an energy post treatment includes heating to a temperature above 200° C. for a time period to cause adjacent Si—$CH_3$ chemical bonds in said deposited layer to change to Si—$CH_2$—Si bonds to increase a modulus of elasticity and hardness of said deposited layer.

4. The method of claim 1 wherein said first organo-silicon precursor is selected from the group consisting of octamethylcyclotetrasiloxane (OMCTS) and 1,3,5,7,-tetraoctamethylcyclotetrasiloxane (TMCTS), diethoxymethylsilane (DEMS), dimethyldimethoxysilane (DMDMOS, diethyldimethoxysilane (DEDMOS), other cyclic and non-cyclic silanes, and other cyclic and non-cyclic siloxanes.

5. The method of claim 1 further including controlling a pressure in said chamber in the range from 5 to 9 Torr.

6. The method of claim 1 wherein applying high frequency radio frequency power includes applying high frequency radio frequency power just above plasma initiation to increase polymerization whereby little plasma dissociation of an organic functional group occurs in said plasma in said chamber.

7. The method of claim 1 wherein applying high frequency radio frequency power includes a power increase above plasma initiation in the range from 75 to 800 watts.

8. The method of claim 1 wherein said heating said substrate includes heating only in a temperature range from 200° C. to 250° C.

9. The method of claim 1 wherein said energy post treatment includes a thermal anneal of heating said deposited layer in the range from 200° C. to 430° C. in an ambient selected from the group consisting of an inert gas and forming gas and for a period of time greater than 40 minutes.

10. The method of claim 1 further including introducing a gas selected from the group consisting of inert Ar, reactive oxidant gas, and oxygenated hydrocarbon gas in said chamber.

11. The method of claim 1 wherein said oxidant gas is selected from the group consisting of $O_2$, $H_2O$, $CH_3OH$, and $C_4H_{10}O$.

12. The method of claim 1 wherein said dielectric layer has a dielectric constant k lower than 2.7 and a modulus of elasticity greater than 7 GPa.

13. The method of claim 1 wherein said dielectric layer has a dielectric constant k lower than 2.5 and a modulus of elasticity greater than 6 GPa.

14. The method of claim 1, wherein said content of C increases with thickness to above 30 percent.

15. The method of claim 1 wherein said introducing a silicon oxide precursor is terminated at times when said graded layer thickness is in the range from 3 nm to 7 nm.

* * * * *